(12) United States Patent
Morey et al.

(10) Patent No.: US 10,983,638 B2
(45) Date of Patent: Apr. 20, 2021

(54) MULTI-STAGE CAPACITIVE SENSOR

(71) Applicant: Johnson Electric International AG, Murten (CH)

(72) Inventors: Alan Roger Morey, Shanklin (GB); Alex James Cowcher, Sandown (GB)

(73) Assignee: JOHNSON ELECTRIC INTERNATIONAL AG, Murten (CH)

( * ) Notice: Subject to any disclaimer, the term of this patent is extended or adjusted under 35 U.S.C. 154(b) by 0 days.

(21) Appl. No.: 16/191,765

(22) Filed: Nov. 15, 2018

(65) Prior Publication Data
US 2019/0155416 A1    May 23, 2019

(30) Foreign Application Priority Data
Nov. 21, 2017 (GB) ...................................... 1719289

(51) Int. Cl.
*G06F 3/044* (2006.01)
*G06F 3/041* (2006.01)
(Continued)

(52) U.S. Cl.
CPC ............ *G06F 3/044* (2013.01); *G06F 3/0414* (2013.01); *G06F 3/0416* (2013.01);
(Continued)

(58) Field of Classification Search
CPC ...... G06F 3/044; G06F 3/0416; G06F 3/0414; G06F 2203/04105; G06F 2203/04104; H03K 17/975; H03K 17/962; H03K 2217/96054; H03K 2217/960705; H03K 17/965
See application file for complete search history.

(56) References Cited

U.S. PATENT DOCUMENTS

2010/0253645 A1   10/2010   Bolender
2012/0098767 A1*   4/2012   Takai .................. G06F 3/041
                                                          345/173
(Continued)

FOREIGN PATENT DOCUMENTS

EP   0640936 A1   3/1995
EP   2546730 A2   1/2013
TW   I605369 B   11/2017

OTHER PUBLICATIONS

UK Search Report under Section 17(5) dated May 15, 2018.

*Primary Examiner* — Temesghen Ghebretinsae
*Assistant Examiner* — Ivelisse Martinez Quiles
(74) *Attorney, Agent, or Firm* — Millman IP Inc.

(57) ABSTRACT

A multi-stage capacitive sensor is provided having a layered structure, including a user-contact surface, a first capacitive sensor for the user-contact surface, a second capacitive sensor which is spaced apart from the first capacitive sensor in a direction away from the user-contact surface, and a conductive member. The conductive member is positioned between the first and second capacitive sensors, and is engaged with the first circuit substrate and spaced apart from the second capacitive sensor. In a preferred embodiment, under the application of a force at the user-contact surface, the conductive member is deflected relative to the second capacitive sensor to alter a distance therebetween to create a detectable change in a capacitance at the second capacitive sensor.

10 Claims, 7 Drawing Sheets

(51) Int. Cl.
*H03K 17/96* (2006.01)
*H03K 17/975* (2006.01)

(52) U.S. Cl.
CPC ......... *H03K 17/962* (2013.01); *H03K 17/975* (2013.01); *G06F 2203/04104* (2013.01); *G06F 2203/04105* (2013.01); *H03K 2217/96054* (2013.01); *H03K 2217/960705* (2013.01)

(56) References Cited

U.S. PATENT DOCUMENTS

| | | | |
|---|---|---|---|
| 2013/0018489 A1* | 1/2013 | Grunthaner | G06F 3/041 700/73 |
| 2016/0197608 A1* | 7/2016 | Morey | H03K 17/962 200/600 |
| 2018/0059823 A1 | 3/2018 | Chang | |

* cited by examiner

MULTI-STAGE CAPACITIVE SENSOR

CROSS REFERENCE TO RELATED APPLICATIONS

This non-provisional patent application claims priority under 35 U.S.C. § 119(a) from Patent Application No. GB1719289.9 filed in the United Kingdom on Nov. 21, 2017.

FIELD OF THE INVENTION

This disclosure relates to a multi-stage capacitive sensor, particularly but not necessarily for use in vehicular dashboard control panels. The disclosure further relates to a human-machine interface using such a multi-stage capacitive sensor, to a method of constructing the multi-stage capacitive sensor, and to a method of providing multi-stage operation for a human-machine interface.

BACKGROUND OF THE INVENTION

Modern automobiles typically use dashboard-mounted controls which utilise switches mounted on or behind the fascias of the dashboard. A user can activate these controls using touch-based technology. Traditionally, mechanical or rotary switches have been provided, for example, to control the air-conditioning, navigation or audio functions within the vehicle.

An issue with mechanical switches is that an aperture must be provided in the fascia and/or fascia support in order to permit user actuation of the switch, and also a large amount of space is required behind the fascia in order to install the movable components of the mechanical switch. This can diminish the aesthetic appeal of the fascia.

Capacitive switches have also been considered. Such switches can be readily integrated behind fascias, without adversely affecting the appearance of the fascia; however, capacitive switches are prone to false-firing when a user brings their hand into close proximity with the switch. This can result in unintentional activation of the functions within the vehicle, and could cause dangerous distractions for the driver.

SUMMARY OF THE INVENTION

A multi-stage capacitive sensor comprises a user-contact surface; a first capacitive sensor positioned at or adjacent to the user-contact surface and which is arranged to act as a capacitive touch sensor for the user-contact surface; a second capacitive sensor which is spaced apart from the first capacitive sensor in a direction away from the user-contact surface; and a conductive member which is positioned between the first and second capacitive sensors, the conductive member being and spaced apart from the second capacitive sensor. Under an application of a force at the user-contact surface, a relative motion of the conductive member and second capacitive sensor is effected such that a distance therebetween is altered to create a detectable change in a capacitance at the second capacitive sensor.

Preferably, the multi-stage capacitive sensor further comprises a first circuit substrate to which the first capacitive sensor is mounted, and a second circuit substrate to which the second capacitive sensor is mounted.

Preferably, the conductive member is a deflectable conductive member which is engaged with the first circuit substrate and which is deflected relative to the second capacitive sensor.

Preferably, the multi-stage capacitive sensor further comprises a spacer element positioned between the first and second circuit substrates, the spacer element defining a cavity between the deflectable conductive member and the second capacitive sensor within which the deflectable conductive member is deflectable.

Preferably, the conductive member is mounted directly to the first circuit substrate.

Preferably, the conductive member is printed onto the first circuit substrate.

Preferably, the conductive member is mounted to a mounting membrane which is attachable to the first circuit substrate.

Preferably, the multi-stage capacitive sensor further comprises a stiffener element affixed to the second circuit substrate.

Preferably, the multi-stage capacitive sensor further comprises an adhesive layer which mounts the first circuit substrate to the user-contact surface.

Preferably, the second circuit substrate is a flexible circuit substrate.

Preferably, the multi-stage capacitive sensor further comprises a rear deflection member which is positioned at or adjacent to the second circuit substrate, wherein the second circuit substrate is deflectable by the rear deflection member under the application of a force at the user-contact surface.

Preferably, at least one projection is provided coupled with the user-contact surface, wherein the second circuit substrate is deflectable by the or each projection under the application of a force at the user-contact surface.

Preferably, the conductive member is formed as a conductive mesh, a continuous conductive plate or coated with a dielectric layer.

Preferably, a plurality of said first capacitive sensors is provided, and each of the plurality of first capacitive sensors is connected via a common electrical connection.

Preferably, a plurality of said second capacitive sensors is provided, and each of the plurality of second capacitive sensors is connected via a common electrical connection.

Preferably, the second capacitive sensor is deflectable towards the conductive member under the application of a force at the user-contact surface.

Preferably, at least one of the conductive member and second conductive sensor is mounted to a mechanically movable element which is movable under the application of a force at the user-contact surface.

Preferably, a projection is provided coupled with the user-contact surface, the conductive member being mounted to the projection to be movable relative to the second capacitive sensor under the application of a force at the user-contact surface.

A human-machine interface for multi-stage control of an electronic device, the human-machine interface comprises a multi-stage capacitive sensor as described-above, wherein the user-contact surface is formed on a control panel of the electronic device.

A method of constructing a multi-stage capacitive sensor, the method comprises the steps of:

a] providing a first capacitive sensor;
b] providing a conductive member which is engagable with the first capacitive sensor;
c] providing a second capacitive sensor;
d] positioning the conductive member between the first and second capacitive sensors, the conductive member being spaced apart from the second capacitive sensor; and
e] affixing the first capacitive sensor at or adjacent to a user-contact surface so as to be arranged to act as a capaci-
} tive touch sensor for the user-contact surface, and that, under the application of a force at the user-contact surface, a relative motion of the conductive member and second capacitive sensor is effected such that a distance therebetween is altered to create a detectable change in a capacitance at the second capacitive sensor.

BRIEF DESCRIPTION OF THE DRAWINGS

A preferred embodiment of the invention will now be described, by way of example only, with reference to figures of the accompanying drawings. In the figures, identical structures, elements or parts that appear in more than one figure are generally labeled with a same reference numeral in all the figures in which they appear. Dimensions of components and features shown in the figures are generally chosen for convenience and clarity of presentation and are not necessarily shown to scale. The figures are listed below.

DETAILED DESCRIPTION OF THE PREFERRED EMBODIMENTS

Hereinafter, particular embodiments of the present disclosure are described in detail in conjunction with the drawings, so that technical solutions and other beneficial effects of the present disclosure are apparent. It can be understood that the drawings are provided only for reference and explanation, and are not used to limit the present disclosure. Dimensions shown in the drawings are only for ease of clear description, but are not limited to a proportional relationship.

Figure 1:
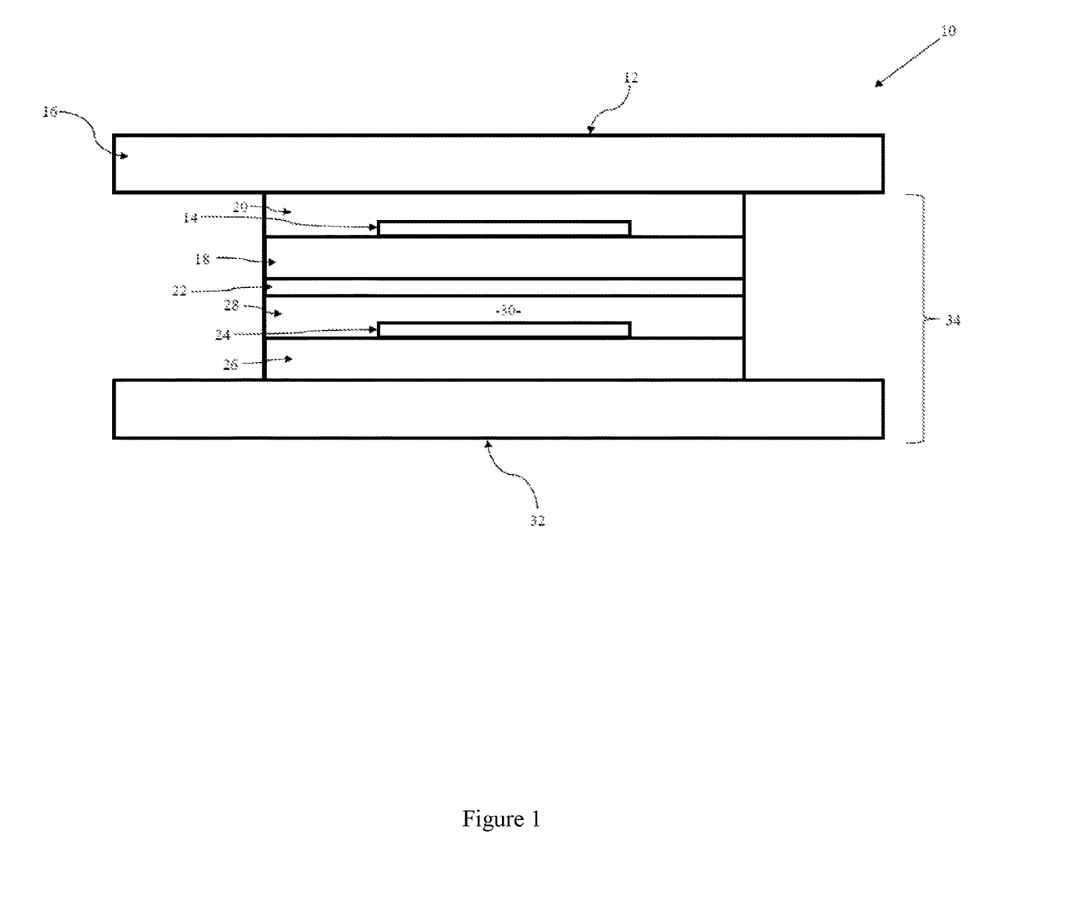
FIG. 1 shows a cross-sectional representation of a first embodiment of a multi-stage capacitive sensor, in accordance with the first aspect of the invention.

Referring to FIG. 1, there is indicated a multi-stage capacitive sensor, reference globally at 10 which is suitable for use as part of a human-machine-interface touch panel, in particular but not necessarily exclusively for installation into automobiles, in particular as part of a dashboard control panel. The multi-stage capacitive sensor 10 is capable of being activated in a two-step process. As a user approaches the multi-stage capacitive sensor 10, there is no activation of the multi-stage capacitive sensor 10. Upon initial contact, the location of the user's finger is determined by the multi-stage capacitive sensor 10, but no triggering is achieved until the user provides a force to perform the triggering and firing of the multi-stage capacitive sensor 10.

The multi-stage capacitive sensor 10 comprises a layered structure having a user-contact surface or element 12 with which a user can interact with the multi-stage capacitive sensor 10, and a first capacitive sensor 14 which is positioned at or adjacent to the user-contact surface 12. The first capacitive sensor 14 is arranged to act as a capacitive touch sensor for the user-contact surface 12, permitting the first stage of the multi-stage triggering process. The user-contact surface 12 is here preferably formed on a user-contact element 16 of a dashboard of a motor vehicle, for example, which may be formed of any material which can be suitably deflected under the application of a user force, such as leather, wood, thin metal, or plastics material. The user-contact surface 12 could, however, be formed on any appropriate user-contact element which is engaged with the multi-stage capacitive sensor 10.

The first capacitive sensor 14 may be preferably supported by a first circuit substrate 18, more preferably being directly mounted to the first circuit substrate 18, though the first capacitive sensor 14 could feasibly be printed onto the first circuit substrate 18. As indicated, the first circuit substrate 18 may preferably be connected to the user-contact element 16 via an adhesive layer 20, which may preferably surround or encapsulate the first capacitive sensor 14 to limit the potential for circuit shorting.

Preferably, the first circuit substrate 18 is provided as a flexible substrate, such as a polymer thick film, but could alternatively be paper, or FR4 circuit board, for example. A dedicated circuit substrate could alternatively be dispensed with, and the first capacitive sensor 14 could be connected directly to a user contact element on a reverse side to the user-contact surface 12. In the depicted embodiment, this would result in direct connection to the rear of the user-contact element 16.

Proceeding through the layered structure of the multi-stage capacitive sensor 10 in a direction away from the user-contact surface 12, there is provided a deflectable conductive member 22 which is engaged or associated with the first circuit substrate 18 such that a force applied at the user-contact surface 12 can deflect the deflectable conductive member 22 in a direction away from the user-contact surface 12.

It will be appreciated that the deflectable conductive member 22 need not necessarily be directly connected to the first circuit substrate 18; an intermediate element could be provided, such as a dedicated mounting membrane which is attachable to the first circuit substrate 18, in order to provide the necessary coupling to the user-contact surface 12.

Preferably, the deflectable conductive member 22 is formed as a conductive mesh; however, any appropriately conductive grounding element could be provided, such as a continuous plate of conductive material. Furthermore, the deflectable conductive member 22 may be provided so as to have a coating of a dielectric layer thereon.

A second capacitive sensor 24 is then provided which is spaced apart from the first capacitive sensor 14 in a direction away from the user-contact surface 12, such that the deflectable conductive member 22 is positioned between the first and second capacitive sensors 14, 24. The second capacitive sensor 24 is preferably mounted to a second circuit substrate 26, towards which the deflectable conductive member 22 can be deflected under the application of a force at the user-contact surface 12.

Preferably, the second circuit substrate 26 is provided as a flexible substrate, such as a polymer thick film, but could alternatively be paper, or FR4 circuit board, for example.

It is preferred that a separation between the deflectable conductive member 22 and second capacitive sensor 24 is provided by the attachment of one or more switch spacer element 28 which interconnect the deflectable conductive member 22, and therefore first circuit substrate 18, to the second circuit substrate 26, thereby defining a cavity 30 within which the second capacitive sensor is located.

In the depicted embodiment, the second circuit substrate 26 is mounted to a rear support or stiffener element 32, which may be a rigid piece of material to prevent deflection of the second capacitive sensor 24 under application of a force at the user-contact surface 12. Preferably, the second circuit substrate 26 is adhesively mounted to the rear stiffener element 32. The rear stiffener element 32 could act as the second circuit substrate, for example, if a rigid printed circuit board were used.

It will be appreciated that, if there is a well-defined relationship between the user-contact surface 12, which may be formed as, for example, the user-contact element 16 of a dashboard in an automobile, and the rear stiffener element 32, that the spacer element 28 could be omitted. The user-contact element 16 can be a fascia of a dashboard in the automobile. The cavity 30 would then be defined by the positional relationship between the user-contact surface 12 and the rear stiffener element 32.

A switch formed as part of a human-machine interface having the multi-stage capacitive sensor 10 is operable as follows: a user touches the user-contact surface 12 to select a function of an electronic device controlled by the human-machine interface. This result in a detectable change at the first capacitance sensor 14. However, no triggering of functionality occurs.

Upon application of a force at the user-contact surface 12, for example, by finger pressure, the user can activate the function of the electronic device. This is achieved by deflection of the deflectable conductive member 22 into the cavity 30 to alter the distance of the deflectable conductive member 22 relative to the second capacitive sensor 24. This results in a detectable change at the second capacitive sensor 24 which can be used to activate the function of the electronic device. It is noted that the second capacitive sensor 24 is either not deflected, or deflected to a lesser degree than the deflectable conductive member 22, under application of the force, allowing the alteration of the distance between the deflectable conductive member 22 and the second capacitive sensor 24.

This arrangement creates a switching arrangement using the multi-stage capacitive sensor 10 having first and second stepwise activation and/or deactivation. It is possible to tune the sensitivity of the multi-stage capacitive sensor 10 by careful selection of the layered structure of the multi-stage capacitive sensor 10. For example, the thickness of the spacer element 28, area and/or depth of the cavity 30, and/or distance between the rear surface of the user-contact element 16 and the rear stiffener element 32 can all be adjusted during assembly of the multi-stage capacitive sensor 10 to selectively adjust the sensitivity of the various stages of the stepwise activation.

The multi-stage capacitive sensor 10 can be constructed as follows. The first capacitive sensor 14 can be mounted to the first circuit substrate 18, and the deflectable conductive member 22 provided which is engagable with the first circuit substrate 18, preferably so as to be spaced apart from and therefore electrically isolated from the first capacitive sensor 14.

The second capacitive sensor 24 is also then mounted to the second circuit substrate 26, and the first and second circuit substrates 18, 26 are connected together such that the deflectable conductive member 22 is positioned between the first and second capacitive sensors 14, 24, and that the deflectable conductive member 22 is spaced apart from the second capacitive sensor 24. Preferably, the connection is achieved using the spacer element 28 interconnecting the first and second circuit substrates 18, 26.

The first circuit substrate 18 can then be mounted to the user-contact surface 12, which may, for example, be a fascia of a dashboard in a motor vehicle, such that the first capacitive sensor 14 is positioned at or adjacent to the user-contact surface 12 so as to be arranged to act as a capacitive touch sensor for the user-contact surface 12. Alternatively, the first capacitive sensor 14 could be mounted directly to a user-contact element defining the user-contact surface 12.

As previously described, under the application of a force at the user-contact surface 12, the deflectable conductive member 22 can then be deflected towards the second capacitive sensor 24 to alter a distance therebetween to create a detectable change in a capacitance at the second capacitive sensor 24.

As such, a human-machine interface for a motor vehicle dashboard can be created by, preferably adhesive, engagement of a capacitive switching assembly 34 to the rear surface of a fascia of the dashboard. The capacitive switching assembly 34 comprises the first capacitive sensor 14, the first circuit substrate 18, the deflectable conductive member 22, the spacer element 28, the second capacitive sensor 24, the second circuit substrate 26, and preferably the rear stiffener 32, if required.

Whilst a single switch and sensor arrangement is depicted in the above-described embodiment, it will be appreciated that a plurality of capacitive sensors could be linked; such arrangements are typically used in slider-type capacitive control arrangements. As such, a plurality of first capacitive sensors, and/or a plurality of second capacitive sensors could be provided, resulting in improved functionality of the multi-stage capacitive sensor. Either of the plurality of sensors could connected together via a common connection, which will enable slider-type functionality.

Figure 2:
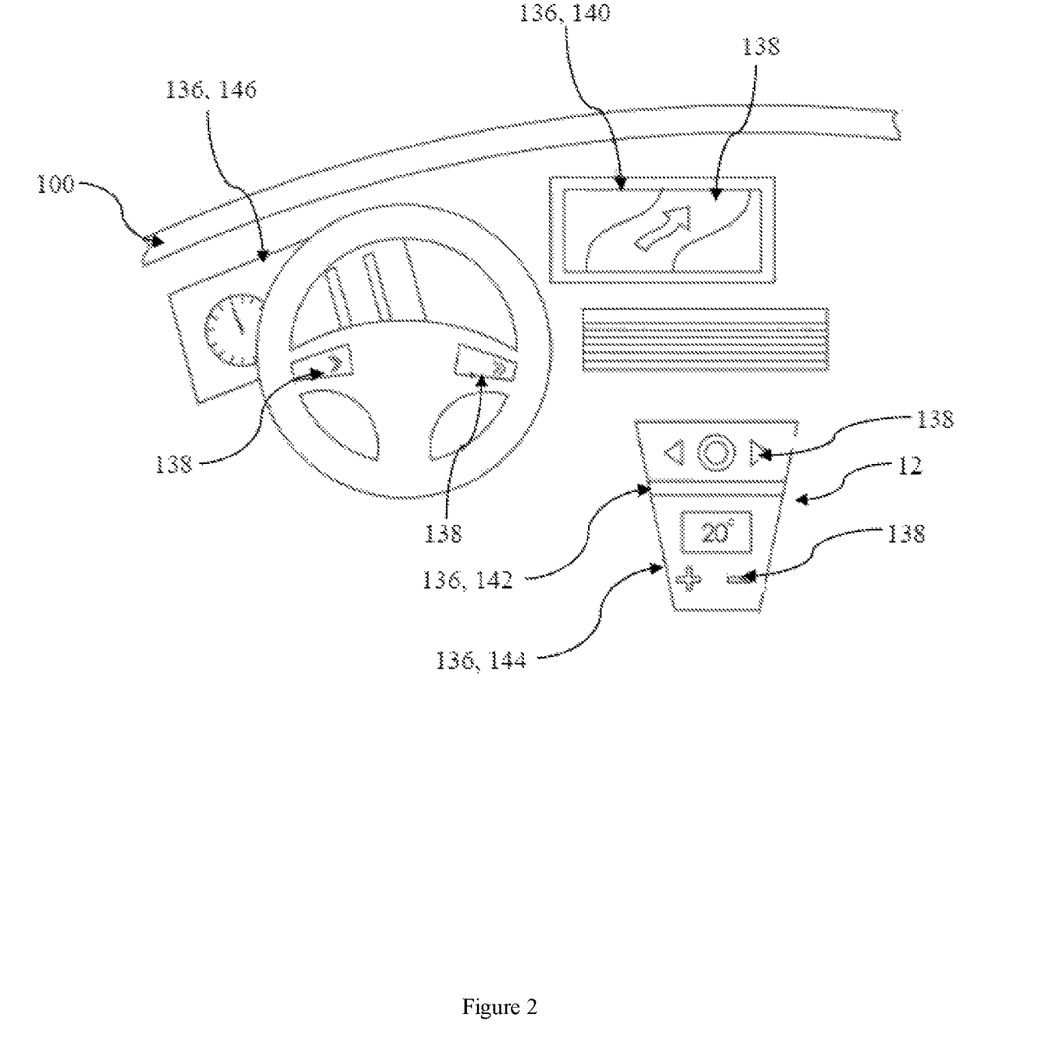
FIG. 2 shows a perspective representation of one embodiment of a human-machine interface as installed in a vehicular dashboard, in accordance with the second aspect of the invention.

In FIG. 2 is shown a stylised view of how the multi-stage capacitive sensor 10 may be integrated into a motor vehicle, the dashboard 100 of which is shown globally. Various different indicators within the vehicle may be presented on display screens 136, for instance, the accelerometer, or temperature gauges.

However, there may also be a number of user interfaces 138 into which the driver or passenger may input commands, and these user interfaces 138 may employ multi-stage switches as herebefore described. Applicable user interfaces 138 could be, but are not limited to, the navigation system 140, the audio system 142, the climate control 144 of the vehicle, or the dashboard display 146. In each case, the user interface 138 forms the user-contact surface 12 on a control panel of the relevant electronic device.

By providing these user-interfaces 138 with multi-stage capacitive sensors 10, the person activating the tools can be certain that there will not be any incidences of false-firing, in which the user accidentally and/or unintentionally activates one or other control. Furthermore, the fascia of the dashboard 100 requires no apertures to be created therein, allowing for an improved visual aesthetic.

Whilst the invention has thus far been described in relation to an arrangement in which a deflectable conductive member is utilised, it will be appreciated that the important characteristic of the sensor is that there is a relative movement between the conductive member and the second capacitive sensor to thereby permit multi-stage capacitive sensing. Some alternative embodiments of the invention are considered below.

Figure 3:
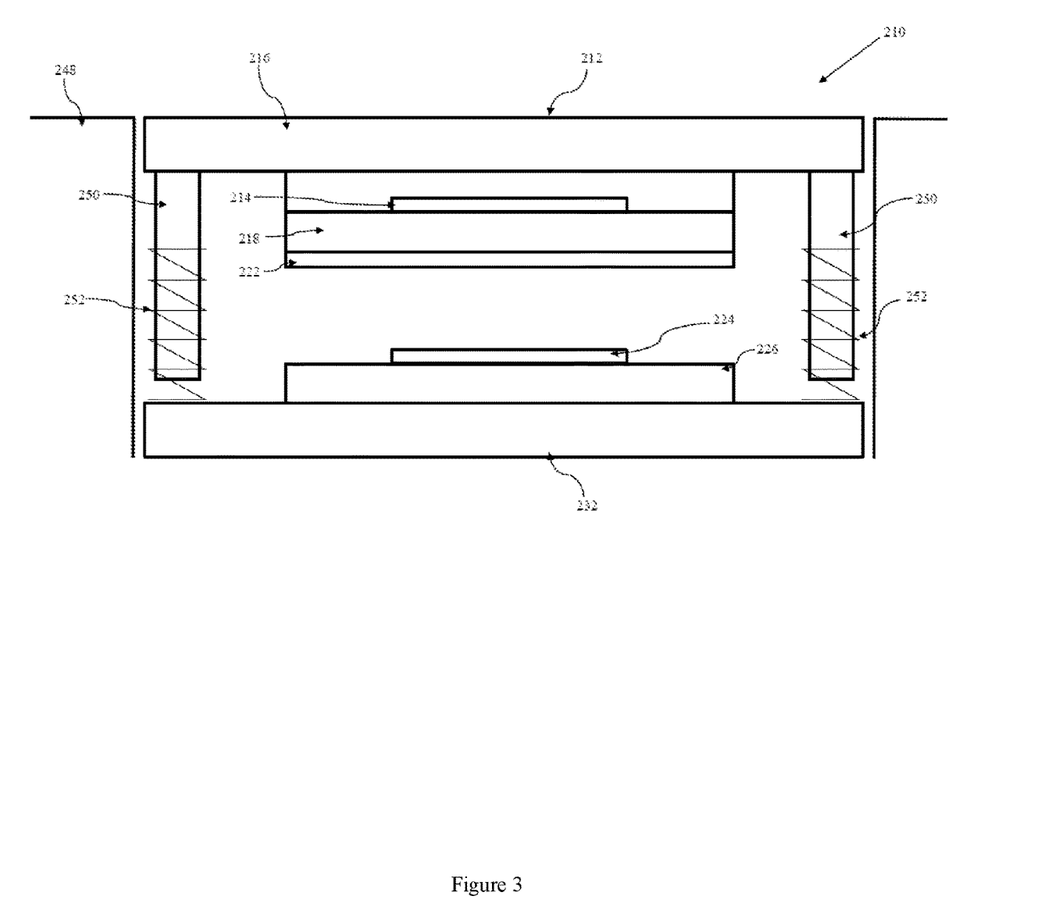
FIG. 3 shows a cross-sectional representation of a second embodiment of a multi-stage capacitive sensor, in accordance with the first aspect of the invention.

A button-type of multi-stage capacitive sensor, indicated globally at 210, is indicated in FIG. 3. Identical or similar components to those described in relation to the first embodiment of the invention will be referred to using identical or similar reference numerals, and further detailed description will be omitted for brevity.

In this multi-stage capacitive sensor 210, the user-contact surface 212 and user-contact element 216 is movable relative to a fascia surface 248 within which the multi-stage capacitive sensor 210 is mounted. The first capacitive sensor 214, first circuit substrate 218, and conductive member 222 are preferably rigidly mounted to a rear surface of the user-contact element 212.

The second capacitive sensor 224 and second circuit substrate 226 are then mounted, preferably to a rear stiffener element 232, though any appropriate support may be used, so as to be spaced apart from and unconnected to the conductive member 222.

A force applied to the user-contact element 212, such as that by an applied user finger, is able to deflect the entire movable contact unit which includes at least the user-contact element 216, first capacitive sensor 214 and conductive member 222.

Here, engagement projections 250 are provided which are connected to and extend from the user-contact element 216, which are mounted via springs 252 to the rear stiffener element 232. This prevents excess force being applied to the user-contact element which would otherwise result in contact between the conductive member 222 and the second capacitive sensor 224. This may also advantageously allow return of the movable contact unit to its initial position.

Figure 4:
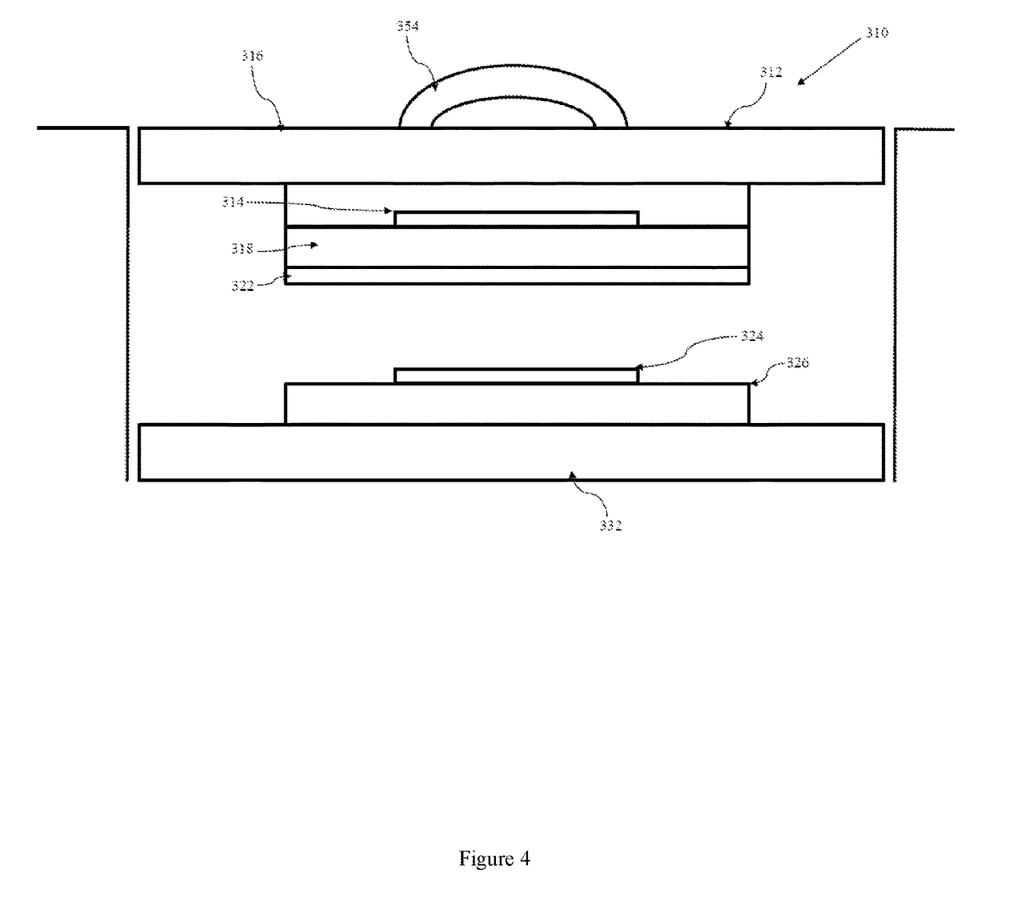
FIG. 4 shows a cross-sectional representation of a third embodiment of a multi-stage capacitive sensor, in accordance with the first aspect of the invention.

A third embodiment of the multi-stage capacitive sensor is indicated globally at 310 in FIG. 4. Identical or similar components to those described in relation to the first and second embodiments of the invention will be referred to using identical or similar reference numerals, and further detailed description will be omitted for brevity.

In this multi-stage capacitive sensor 310, a movable contact unit is again provided which comprises at least the user-contact element 316 carrying the user-contact surface 312, the first capacitive sensor 314, first circuit substrate 318, and the conductive member 322. This movable contact unit is movable towards the second capacitive sensor 324, second circuit substrate 326, and rear stiffener element 332, if present, to alter the distance between the conductive member 322 and second capacitive sensor 324.

However, there is also provided a grippable element 354 positioned on or adjacent to either the user-contact surface 312 or user contact element 316, via which the user is able to manipulate the movable contact unit. In the depicted embodiment of the multi-stage capacitive sensor 310, this is formed as a grippable handle, but other engagement elements, such as knobs or dials, could be considered, for example.

Figure 5:
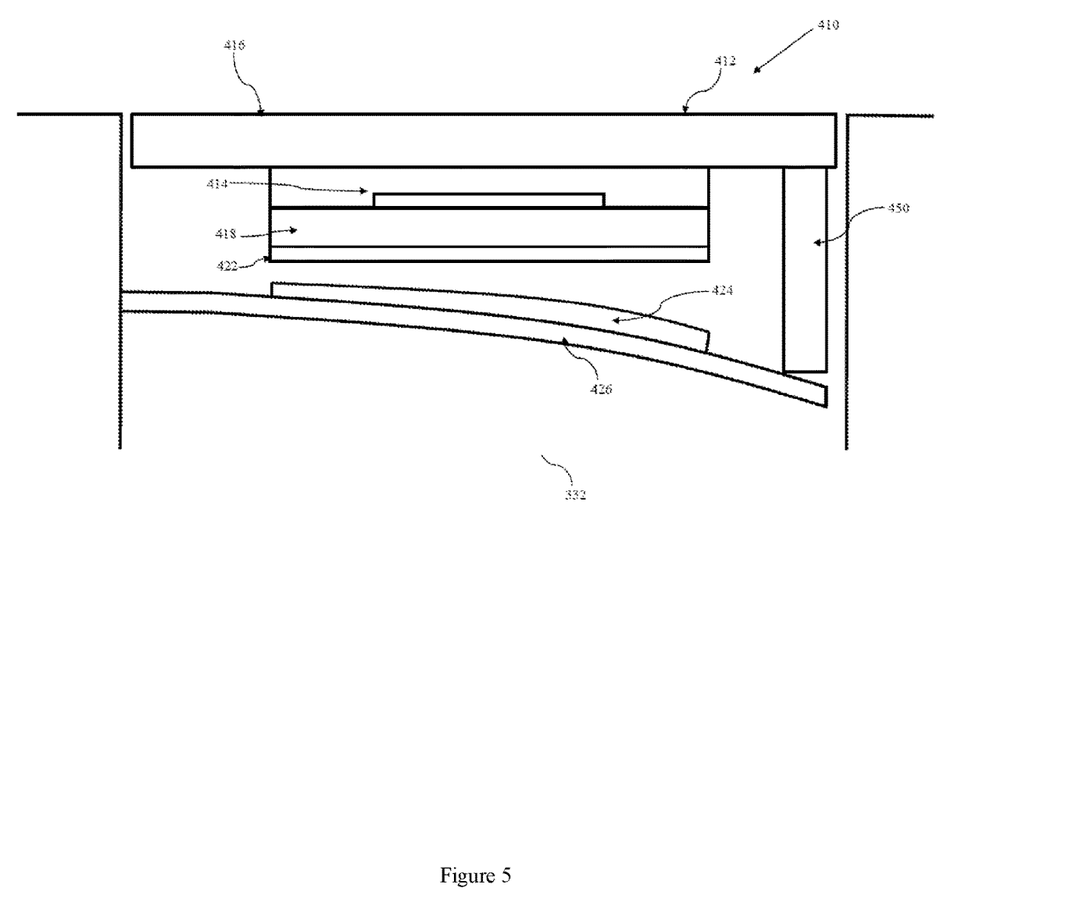
FIG. 5 shows a cross-sectional representation of a fourth embodiment of a multi-stage capacitive sensor, in accordance with the first aspect of the invention.

A fourth embodiment of a multi-stage capacitive sensor is indicated globally at 410 in FIG. 5. Identical or similar components to those described in relation to the first, second and third embodiments of the invention will be referred to using identical or similar reference numerals, and further detailed description will be omitted for brevity.

In this multi-stage capacitive sensor 410, a movable contact unit is again provided which comprises at least the user-contact element 416 carrying the user-contact surface 412, the first capacitive sensor 414, first circuit substrate 418, and the conductive member 422. A projection 450 is also provided on a rear surface of the user-contact element 416.

The second circuit substrate 426 is here provided as a flexible or at least in part flexible circuit substrate, which is contactable by the projection 450. The second capacitive sensor 424 is then mounted to the second circuit substrate 426. The application of a user force at the user-contact surface 412 is able to urge the projection towards the second circuit substrate 426, deflecting the second capacitive sensor 424 away from the conductive member 422, thereby resulting in a detectable change in the capacitance.

It will be appreciated that if a deflectable fascia is provided as the user-contact element 416 in this arrangement, that the movable contact unit may not be necessary; sufficient flexion in the fascia may allow for movement of the projection 450 relative to the second capacitive sensor 424.

Figure 6:
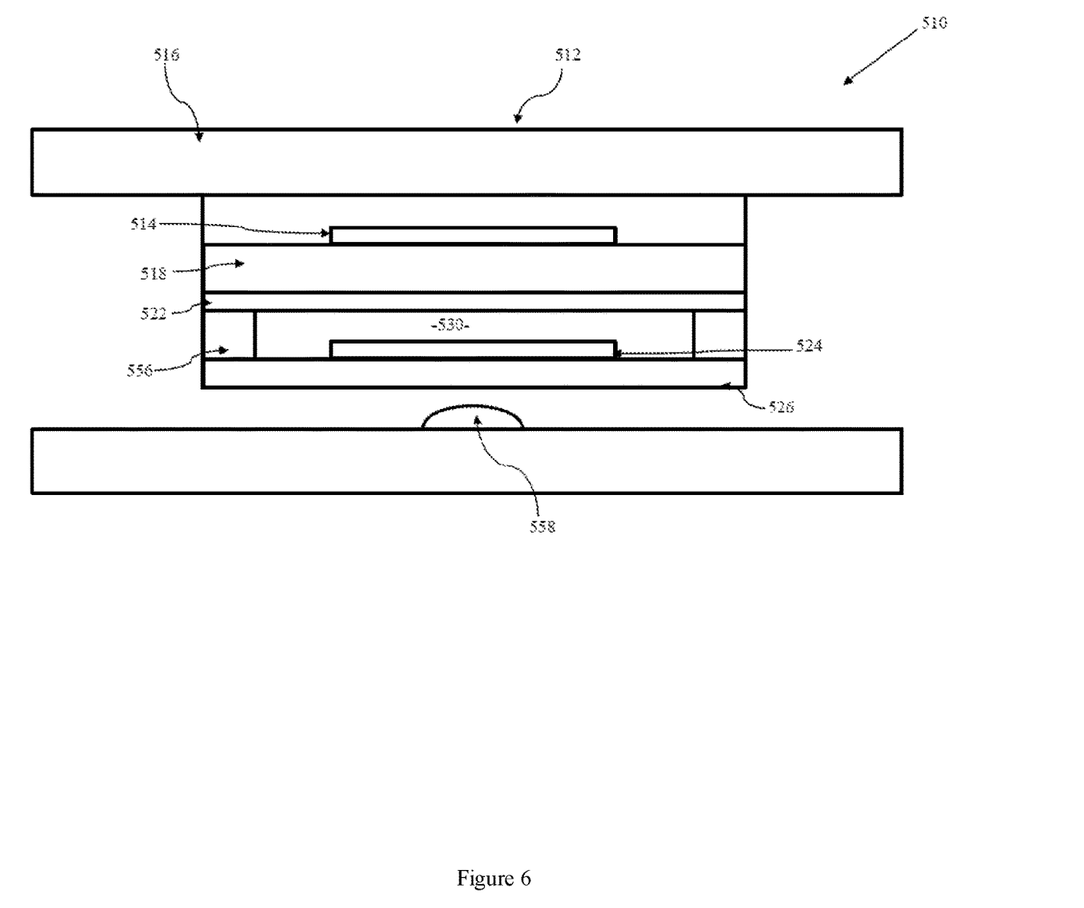
FIG. 6 shows a cross-sectional representation of a fifth embodiment of a multi-stage capacitive sensor, in accordance with the first aspect of the invention.

A fifth embodiment of a multi-stage capacitive sensor is indicated globally at 510 in FIG. 6. Identical or similar components to those described in relation to the first to fourth embodiments of the invention will be referred to using identical or similar reference numerals, and further detailed description will be omitted for brevity.

The first capacitive sensor 514, first circuit substrate 518, and conductive member 522 are preferably rigidly mounted to the user-contact element 516. However, here, the second circuit substrate 526 is a flexible circuit substrate which is mounted to the conductive member 522, or otherwise coupled to the user-contact element 516 such that a force on the user-contact surface acts to urge the second circuit substrate 526 away from the user-contact element 516. This mounting may be achieved by providing an adhesive layer 556, for instance, which permits a cavity 530 to be formed between the conductive member 522 and the second circuit substrate 526.

A rear deflection element 558 is then provided which is contactable with the second circuit substrate 526 under the application of a force at the user-contact surface 512, such that the second capacitive sensor 524 is deflected towards the conductive member 522, resulting in a detectable capacitance change.

Figure 7:
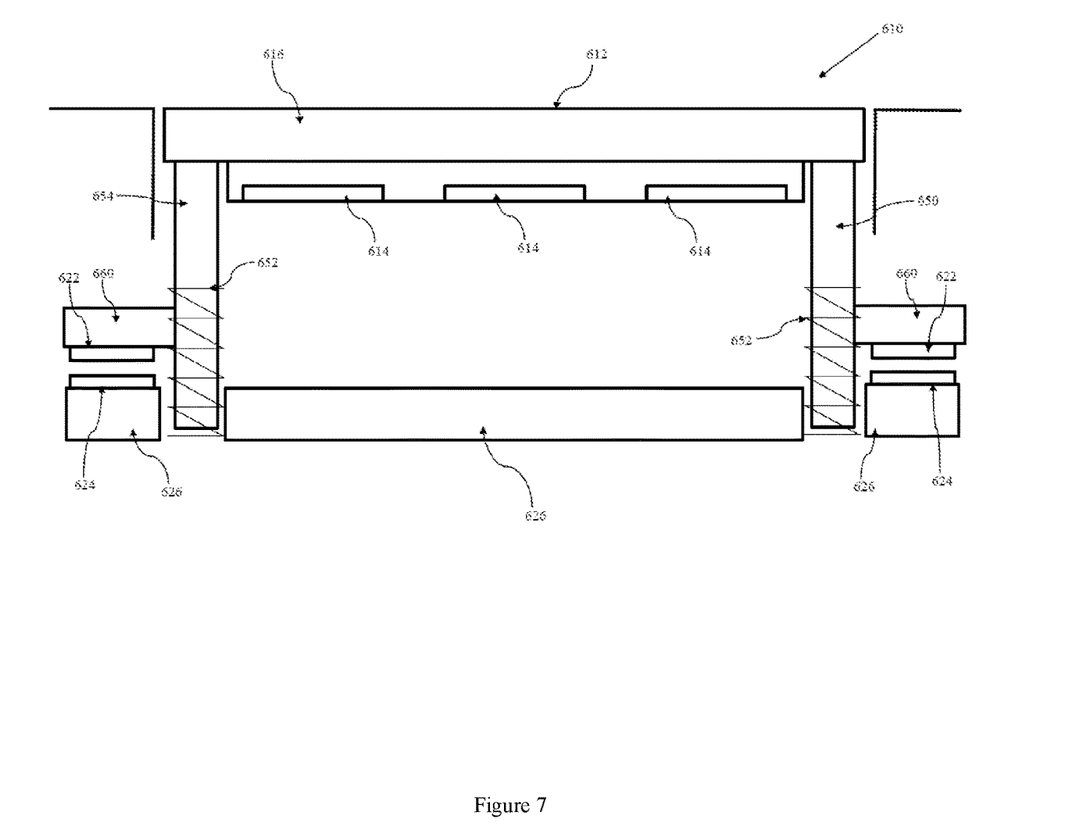
FIG. 7 shows a cross-sectional representation of a sixth embodiment of a multi-stage capacitive sensor, in accordance with the first aspect of the invention.

A sixth embodiment of the multi-stage capacitive sensor is indicated globally at 610 in FIG. 7. Identical or similar components to those described in relation to the first to fourth embodiments of the invention will be referred to using identical or similar reference numerals, and further detailed description will be omitted for brevity.

A movable contact unit is provided in which the user-contact element 616, carrying the user-contact surface 612, has on its rear surface at least one, and preferably a plurality of, first capacitive sensors 614 is provided. Here, the first capacitive sensors 614 are adhered directly to the user-contact element 616, which may act as the first circuit substrate.

At least one, and here two, projections 650 are provided, which are mounted via springs 652, with each projection 650 having a mounting element 660 thereon, which in this embodiment extends laterally of the projection 650. Preferably, this lateral extension is in a direction away from the first capacitive sensors 614, as illustrated, although a more traditional 'sandwich' construction could be considered. The conductive member 622 is mounted to the respective mounting element 660.

The second capacitive sensor or sensors 624 are then mounted to the second circuit substrate 626, here illustrated as a rigid circuit substrate, and the motion of the movable contact unit urges the conductive members 622 towards or away from the second capacitive sensors 624, thereby creating the detectable capacitance change.

It will be appreciated that multi-stage switch technology could readily be applied to all fields in which a touch-detectable fascia or touch-detectable, preferably flexible, membrane interface may be utilised. Furthermore, the user-contact surface 12 could feasibly comprise or include a touch-screen.

It will be appreciated that any combination of electrical contact form could be provided for each electrical contact used in the multi-stage capacitive sensor 10, depending upon its function, such as single shorting pads, multiple contact pads, and with and without dielectric spacers, and the above-described contacts should not be considered to be an exhaustive list.

One of the advantages of using a user-contact surface 12 which forms part of a display screen as part of the user interface of the device is that it is generally at least in part transparent or translucent. It is therefore possible to provide a lighting element within the switch, such as an LED assembly, which illuminates the display and/or user interface, helping the user to quickly identify the functionality of the switch.

It is therefore possible to provide a multi-stage capacitive sensor particularly suited for use as a control switch for electronic devices in automotive contexts. The multi-stage capacitive sensor requires a touch to select a function and then application of a force to confirm selection by the user. This advantageously obviates many of the issues associated with false firing of capacitive sensors in vehicles, and also requires no aperture to be drilled through a vehicular fascia, as is the case for mechanical or rotary switches. A homogenous fascia can therefore be maintained, without compromising the utility of the control functionality.

In the description and claims of the present application, each of the verbs "comprise", "include", "contain" and "have", and variations thereof, are used in an inclusive sense, to specify the presence of the stated item or feature but do not preclude the presence of additional items or features.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The embodiments described above are provided by way of example only, and various other modifications will be apparent to persons skilled in the field without departing from the scope of the invention as defined by the appended claims.

The invention claimed is:

1. A multi-stage capacitive sensor comprising:
    a user-contact surface;
    a first capacitive sensor positioned at or adjacent to the user-contact surface and which is arranged to act as a capacitive touch sensor for the user-contact surface;
    a second capacitive sensor which is spaced apart from the first capacitive sensor in a direction away from the user-contact surface; and
    a conductive member which is positioned between the first capacitive sensor and the second capacitive sensor, the conductive member being and spaced apart from the second capacitive sensor;
    wherein, under an application of a force at the user-contact surface, a relative motion of the conductive member and the second capacitive sensor is effected such that a distance therebetween is altered to create a detectable change in a capacitance at the second capacitive sensor;
    the multi-stage capacitive sensor further comprises a first circuit substrate to which the first capacitive sensor is mounted, and a second circuit substrate to which the second capacitive sensor is mounted;
    the first capacitive sensor, the first circuit substrate, and the conductive member are rigidly mounted to the user-contact surface;
    the second circuit substrate is a flexible circuit substrate coupled to the conductive member;
    a rear deflection element is contactable with the second circuit substrate under the application of the force at the user-contact surface, such that the second capacitive sensor is deflected towards the conductive member; and
    the rear deflection element has a curved surface protruding toward the second circuit substrate.

2. The multi-stage capacitive sensor of claim 1, wherein the conductive member is mounted directly to the first circuit substrate.

3. The multi-stage capacitive sensor of claim 2, wherein the conductive member is printed onto the first circuit substrate.

4. The multi-stage capacitive sensor of claim 1, wherein the conductive member is mounted to a mounting membrane which is attachable to the first circuit substrate.

5. The multi-stage capacitive sensor of claim 1, further comprising an adhesive layer which mounts the first circuit substrate to the user-contact surface.

6. The multi-stage capacitive sensor of claim 1, wherein the second circuit substrate is mounted to the conductive member by an adhesive layer, and a cavity is formed between the conductive member and the second circuit substrate.

7. The multi-stage capacitive sensor of claim 1, wherein the conductive member is formed as a conductive mesh, a continuous conductive plate or coated with a dielectric layer.

8. The multi-stage capacitive sensor of claim 1, wherein a plurality of first capacitive sensors is provided, and each of the plurality of first capacitive sensors is connected via a common electrical connection.

9. The multi-stage capacitive sensor of claim 1, wherein a plurality of second capacitive sensors is provided, and each of the plurality of second capacitive sensors is connected via a common electrical connection.

10. A human-machine interface for multi-stage control of an electronic device, the human-machine interface comprising: a multi-stage capacitive sensor of claim 1, wherein the user-contact surface is formed on a control panel of the electronic device.

* * * * *